United States Patent
Lin

(10) Patent No.: US 11,016,383 B2
(45) Date of Patent: May 25, 2021

(54) PELLICLE FOR AN EUV LITHOGRAPHY MASK AND A METHOD OF MANUFACTURING THEREOF

(71) Applicant: TAIWAN SEMICONDUCTOR MANUFACTURING CO., LTD., Hsinchu (TW)

(72) Inventor: Yun-Yue Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 179 days.

(21) Appl. No.: 16/427,980

(22) Filed: May 31, 2019

(65) Prior Publication Data

US 2020/0073230 A1 Mar. 5, 2020

Related U.S. Application Data

(60) Provisional application No. 62/725,984, filed on Aug. 31, 2018.

(51) Int. Cl.
| | |
|---|---|
| *G03F 1/62* | (2012.01) |
| *G03F 1/80* | (2012.01) |
| *G03F 1/22* | (2012.01) |

(52) U.S. Cl.
CPC .............. *G03F 1/62* (2013.01); *G03F 1/22* (2013.01); *G03F 1/80* (2013.01)

(58) Field of Classification Search
CPC .............. G03F 1/62; G03F 1/80; G03F 1/22
See application file for complete search history.

(56) References Cited

U.S. PATENT DOCUMENTS

| | | | |
|---|---|---|---|
| 8,796,666 | B1 | 8/2014 | Huang et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 9,618,837 | B2 | 4/2017 | Lu et al. |
| 9,869,928 | B2 | 1/2018 | Huang et al. |
| 9,869,934 | B2 | 1/2018 | Huang et al. |
| 9,869,939 | B2 | 1/2018 | Yu et al. |
| 2016/0334698 | A1* | 11/2016 | Jeon .................... G03F 1/64 |
| 2017/0090278 | A1* | 3/2017 | Chiu .................... G03F 1/62 |
| 2017/0205705 | A1* | 7/2017 | Ma ...................... G03F 1/64 |

* cited by examiner

*Primary Examiner* — Stewart A Fraser
(74) *Attorney, Agent, or Firm* — McDermott Will & Emery LLP

(57) ABSTRACT

A pellicle for an EUV photo mask includes a first capping layer, a matrix layer disposed over the first capping layer, a second capping layer disposed over the matrix layer; and a metallic layer disposed over the second capping layer.

20 Claims, 11 Drawing Sheets

PELLICLE FOR AN EUV LITHOGRAPHY MASK AND A METHOD OF MANUFACTURING THEREOF

RELATED APPLICATION

This application claims priority of U.S. Provisional Patent Application No. 62/725,984 filed on Aug. 31, 2018, the entire contents of which are incorporated herein by reference.

BACKGROUND

A pellicle is a thin transparent film stretched over a frame that is glued over one side of a photo mask to protect the photo mask from damage, dust and/or moisture. In EUV lithography, a pellicle having a high transparency in the EUV wavelength region, a high mechanical strength and a low thermal expansion is generally required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 shows a cross sectional view of one of the various stages for manufacturing a pellicle for an EUV photo mask in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

A pellicle is a thin transparent film stretched over a frame that is attached over one side of a photo mask, and protects the photo mask from particles, dust, damage and/or contamination. A pellicle generally requires a high transparency and a low reflectivity. In UV or DUV lithography, the pellicle film is made of a transparent resin film. In EUV lithography, however, a resin based film would not be acceptable, and a non-organic material, such as a polysilicon, silicide or graphite, is used.

In the present disclosure, the pellicle for an EUV photo mask has a stacked structure of various dielectric, semiconductor and/or metallic materials to enhance EUV transmittance, to reduce EUV reflectance, to improve mechanical strength, and/or to improve thermal properties. In particular, the pellicle according to the present disclosure has an EUV transmittance higher than about 85% in some embodiments, and higher than about 87% in other embodiments, and has an EUV reflectance lower than about 0.25% in some embodiments, and lower than about 0.10% in other embodiments.

FIGS. 1-11 show a sequential manufacturing operation for a pellicle for an EUV photo mask in accordance with an embodiment of the present disclosure. It is understood that additional operations can be provided before, during, and after the processes shown by FIGS. 1-11, and some of the operations described below can be replaced or eliminated, for additional embodiments of the method. The order of the operations/processes may be interchangeable.

As shown in FIG. 1, a substrate 10, for example a Si wafer, is prepared. The thickness of the substrate 10 is in a range from about 500 µm to about 1000 µm in some embodiments.

Figure 2:
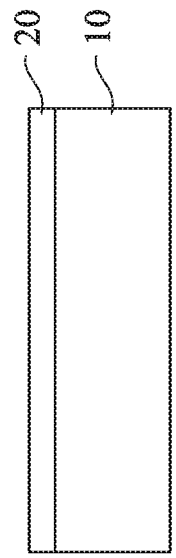
FIG. 2 shows a cross sectional view of one of the various stages for manufacturing a pellicle for an EUV photo mask in accordance with an embodiment of the present disclosure.

On the substrate 10, a first capping layer 20 is formed, as shown in FIG. 2. The first capping layer 20 functions as an etching stop layer in a subsequent substrate etching operation. The first capping layer 20 includes one or more layers of semiconductor material, such as SiC, SiGe, Ge; or dielectric material, such as silicon oxide, silicon nitride, silicon oxynitride and SiCN; or any other suitable material. In some embodiments, SiC is epitaxially formed on the substrate 10. In other embodiments, the first capping layer 20 can be an amorphous or polycrystalline SiC, SiGe or Ge layer. In certain embodiments, the first capping layer 20 is silicon nitride. The thickness of the first capping layer 20 is in a range from about 0.5 nm to about 40 nm in some embodiments, and is in a range from about 1 nm to about 20 nm in other embodiments. The first capping layer 20 can be formed by chemical vapor deposition (CVD), physical vapor deposition (PVD), atomic layer deposition (ALD), molecular beam epitaxy (MBE) and any other suitable film formation methods.

Figure 3:
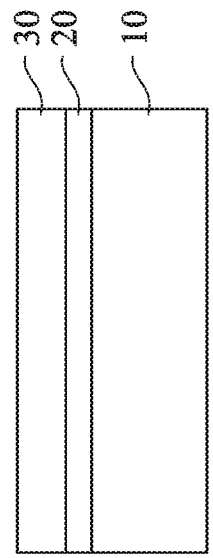
FIG. 3 shows a cross sectional view of one of the various stages for manufacturing a pellicle for an EUV photo mask in accordance with an embodiment of the present disclosure.

After the first capping layer 20 is formed, a matrix layer 30 is formed over the first capping layer 20, as shown in FIG. 3. In some embodiments, the matrix layer 30 includes a semiconductor material, such as Si, SiC, SiGe; metal alloys, such as silicide (WSi, NiSi, TiSi, CoSi, MoSi, ZrSi, etc.); or dielectric material, such as silicon nitride. In some embodiments, the silicide layer is subjected to a nitridation operation or an oxidation operation to form, for example, MoSiN, ZrSiN, MoSiO or ZrSiO. The semiconductor material can be single crystalline, poly crystalline or amorphous. In certain embodiments, the matrix layer 30 includes a MoSi layer or a ZrSi layer. The thickness of the matrix layer 30 is in a range from about 5 nm to about 50 nm in some embodiments, and is in a range from about 20 nm to about 40 nm in other embodiments. The matrix layer 30 can be formed by CVD, PVD, ALD, MBE and any other suitable film formation methods. After the matrix layer 30 is formed, an annealing operation at about 250° C. to about 1100° C. is performed in some embodiments.

Figure 4:
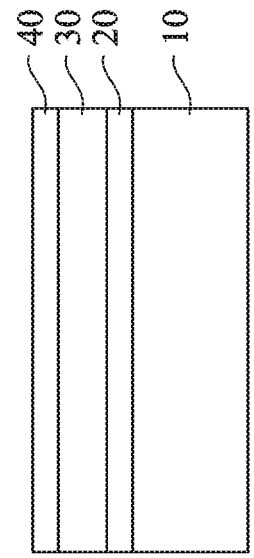
FIG. 4 shows a cross sectional view of one of the various stages for manufacturing a pellicle for an EUV photo mask in accordance with an embodiment of the present disclosure.

Then, a second capping layer 40 is formed over the matrix layer 30, as shown in FIG. 4. The second capping layer 40 includes one or more layers of semiconductor material, such as SiC, SiGe, Ge; or dielectric material, such as silicon oxide, silicon nitride, silicon oxynitride and SiCN; or any other suitable material. The thickness of the second capping layer 40 is in a range from about 0.5 nm to about 40 nm in some embodiments, and is in a range from about 1 nm to about 20 nm in other embodiments. The second capping layer 40 can be formed by CVD, PVD, ALD, MBE and any other suitable film formation methods. The material of the second capping layer 40 can be the same as or different from the material of the first capping layer 20.

Figure 5:
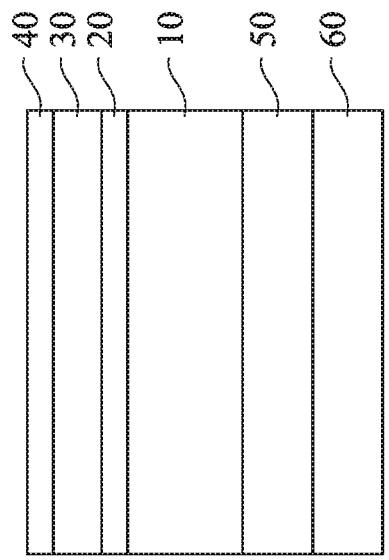
FIG. 5 shows a cross sectional view of one of the various stages for manufacturing a pellicle for an EUV photo mask in accordance with an embodiment of the present disclosure.

Next, as shown in FIG. 5, a backside coating layer 50 is formed over the back side of the substrate 10. The backside coating layer 50 includes one or more layers of dielectric material, such as silicon oxide, silicon nitride, silicon oxynitride and SiCN. In other embodiments, a metallic layer is used. The thickness of the backside coating layer 50 is in a range from about 100 nm to about 1000 nm in some embodiments, and is in a range from about 200 nm to about 500 nm in other embodiments. The backside coating layer 50 can be formed by CVD, PVD, ALD, MBE and any other suitable film formation methods.

Figure 6:
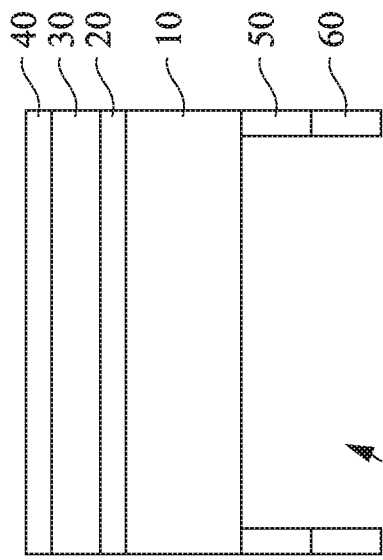
FIG. 6 shows a cross sectional view of one of the various stages for manufacturing a pellicle for an EUV photo mask in accordance with an embodiment of the present disclosure.
Figure 7:
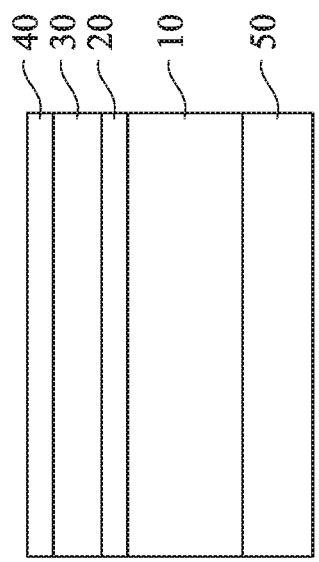
FIG. 7 shows a cross sectional view of one of the various stages for manufacturing a pellicle for an EUV photo mask in accordance with an embodiment of the present disclosure.

Then, a photo resist layer 60 is formed on the backside coating layer 50, as shown in FIG. 6. The thickness of the photo resist layer 60 is in a range from about 1 µm to about 3 µm in some embodiments. One or more lithography operations are performed to pattern the photo resist layer 60, and subsequently, the backside coating layer 50 is patterned by one or more etching operations to form a first opening 65 as shown in FIG. 7.

Figure 8:
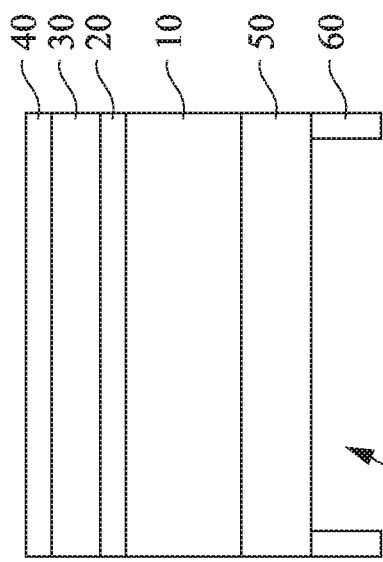
FIG. 8 shows a cross sectional view of one of the various stages for manufacturing a pellicle for an EUV photo mask in accordance with an embodiment of the present disclosure.
Figure 9:
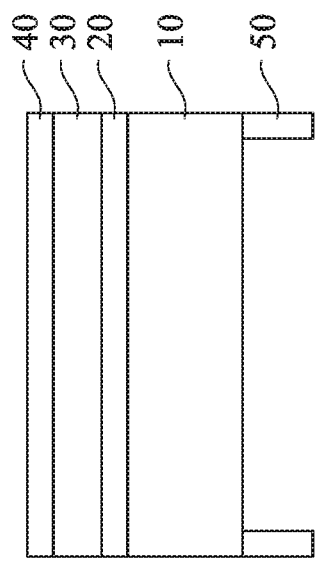
FIG. 9 shows a cross sectional view of one of the various stages for manufacturing a pellicle for an EUV photo mask in accordance with an embodiment of the present disclosure.

Then, the backside coating layer 50 is etched by using the patterned photo resist layer 60 as an etching mask to form a second opening 55, as shown in FIG. 8. The etching is one or more of dry etching and wet etching operations. The photo resist layer 60 is removed by suitable resist removal operations, as shown in FIG. 9.

Figure 10:
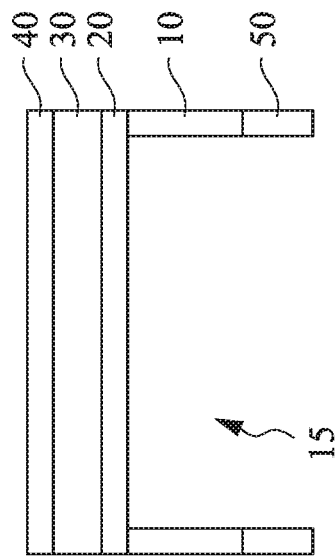
FIG. 10 shows a cross sectional view of one of the various stages for manufacturing a pellicle for an EUV photo mask in accordance with an embodiment of the present disclosure.

Then, the substrate 10 is etched to form a third opening 15, as shown in FIG. 10. In some embodiments, wet etching using KOH, TMAH (tetramethylammonium hydroxide) or EDP (ethylenediamine pyrocatechol) is performed to etch the Si substrate 10. The substrate 10 can also be etched by a dry etching process using one or more of $SF_6$, $CF_4$ and $Cl_2$ gas, mixed with $N_2$ and/or $O_2$ gas. In some embodiments, the substrate below the third opening 15 is etched to expose the first capping layer 20. By this etching operation, a frame structure of the pellicle is formed by a part of the substrate 10 and a part of the backside coating layer 50.

Figure 11:
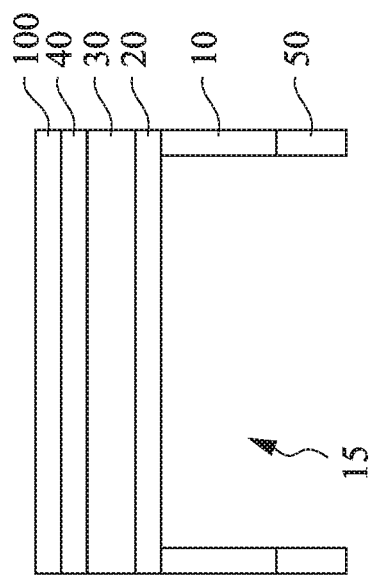
FIG. 11 shows a cross sectional view of one of the various stages for manufacturing a pellicle for an EUV photo mask in accordance with an embodiment of the present disclosure.

Next, as shown in FIG. 11, one or more metallic layers 100 are formed over the second capping layer 40. In some embodiments, the metallic layer 100 includes a layer of Mo, Zr, Nb, B, Ti, Ru, MoSi, ZrSi, NbSi or NiZrSi, or other suitable material. In some embodiments, the metallic layer 100 includes a Ru layer. In some embodiments, the metallic layer 100 includes a Ru layer formed on a Mo layer or a MoSi layer. In other embodiments, a Ru layer formed on a Zr layer is used. In certain embodiments, only a Zr layer is formed on the second capping layer 40. In certain embodiments, only a Ru layer is formed on the second capping layer 40. The thickness of the metallic layer 100 is in a range from about 0.5 nm to about 20 nm in some embodiments, and is in a range from about 1 nm to about 10 nm in other embodiments. The metallic layer 100 can be respectively formed by CVD, PVD, ALD, electro plating, and any other suitable film formation methods. In certain embodiments, any or all of the metallic layers are further formed on the inside walls of the third opening 15. In some embodiments, all of the layers of the pellicle are solid and non-porous layers. In certain embodiments, all of the layers of the pellicle are inorganic.

FIGS. 12-23 show a sequential manufacturing operation for a pellicle for an EUV photo mask in accordance with an embodiment of the present disclosure. It is understood that additional operations can be provided before, during, and after the processes shown by FIGS. 12-23, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1-11 may be employed in the following embodiments, and some of the explanations may be omitted. Similarly, materials, configurations, dimensions, structures, conditions and operations the same as or similar to those explained with respect to FIGS. 12-23 may be employed in the foregoing embodiments.

Figure 12:
FIG. 12 shows a cross sectional view of one of the various stages for manufacturing a pellicle for an EUV photo mask in accordance with another embodiment of the present disclosure.

As shown in FIG. 12, a substrate 10, for example a Si wafer, is prepared. The thickness of the substrate 10 is in a range from about 500 µm to about 1000 µm in some embodiments.

Figure 13:
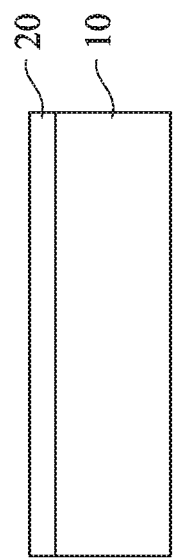
FIG. 13 shows a cross sectional view of one of the various stages for manufacturing a pellicle for an EUV photo mask in accordance with another embodiment of the present disclosure.
Figure 14:
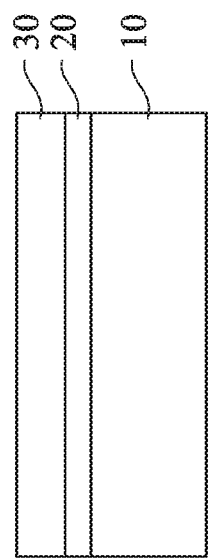
FIG. 14 shows a cross sectional view of one of the various stages for manufacturing a pellicle for an EUV photo mask in accordance with another embodiment of the present disclosure.

On the substrate 10, a first capping layer 20, as an etching stop layer, is formed, as shown in FIG. 13. The first capping layer 20 functions as an etching stop layer in a subsequent substrate etching operation. The first capping layer 20 includes one or more layers of semiconductor material, such as SiC, SiGe, Ge, or dielectric material, such as silicon oxide, silicon nitride, SiCN, and silicon oxynitride, or any other suitable material. In some embodiments, SiC is epitaxially formed on the substrate 10. In other embodiments, the first capping layer 20 can be an amorphous or polycrystalline SiC, SiGe or Ge layer. In certain embodiments, the first capping layer 20 is silicon nitride. The thickness of the capping layer is in a range from about 0.5 nm to about 40 nm in some embodiments, and is in a range from about 1 nm to about 20 nm in other embodiments. The first capping layer 20 can be formed by chemical vapor deposition (CVD), physical vapor deposition (PVD), atomic layer deposition (ALD), molecular beam epitaxy (MBE) and any other suitable film formation methods.

After the first capping layer 20 is formed, a matrix layer 30 is formed over the first capping layer 20, as shown in FIG. 3. In some embodiments, the matrix layer 30 includes semiconductor material, such as Si, SiC, SiGe; metal alloys, such as silicide (WSi, NiSi, TiSi, CoSi, MoSi, etc.); or dielectric material, such as silicon nitride. The semiconductor material can be single crystalline, poly crystalline or amorphous. In certain embodiments, the matrix layer 30 includes a MoSi or a Si layer. The thickness of the matrix layer 30 is in a range from about 1 nm to about 50 nm in some embodiments, and is in a range from about 1 nm to about 40 nm in other embodiments. The matrix layer 30 can be formed by CVD, PVD, ALD and any other suitable film formation methods.

Figure 15:
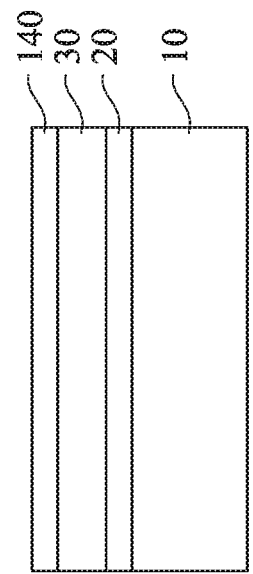
FIG. 15 shows a cross sectional view of one of the various stages for manufacturing a pellicle for an EUV photo mask in accordance with another embodiment of the present disclosure.

Next, as shown in FIG. 15, a stable layer 140 is formed over the matrix layer 30. The stable layer 140 includes one or more layers of Nb, Mo, Zr, MoSi, boron and carbon, and their alloy in some embodiments. The carbon layer can be an amorphous carbon. The stable layer 140 prevents metal diffusion between the matrix layer 30 and the second capping layer 40. The thickness of the stable layer 140 is in a range from about 0.5 nm to about 50 nm in some embodiments, and in a range from about 2 nm to about 5 nm in other embodiments. In some embodiment, the stable layer is two layers, such as Nb/Mo (a Nb layer on a Mo layer), Nb/Zr, Mo/MoSi or Mo/C. The thicknesses of each of the two layers is in a range from about 0.5 nm to about 30 nm in some embodiments. The stable layer 140 can be formed by CVD, PVD, ALD and any other suitable film formation methods.

Figure 16:
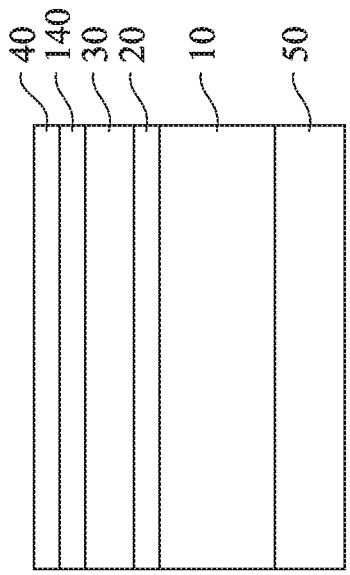
FIG. 16 shows a cross sectional view of one of the various stages for manufacturing a pellicle for an EUV photo mask in accordance with another embodiment of the present disclosure.

Then, a second capping layer 40 is formed over the stable layer 140, as show in FIG. 16. The second capping layer 40 includes one or more layers of silicon nitride and SiC, in some embodiments. In other embodiments, the second capping layer 40 is formed by implanting impurities in the Si core layer. The impurities can be boron, phosphorous and/or arsenic. The thickness of the second capping layer 40 is in a range from about 0.5 nm to about 10 nm in some embodiments, and is in a range from about 1 nm to about 5 nm in other embodiments. The second capping layer 40 can be formed by CVD, PVD, ALD and any other suitable film formation methods.

Figure 17:
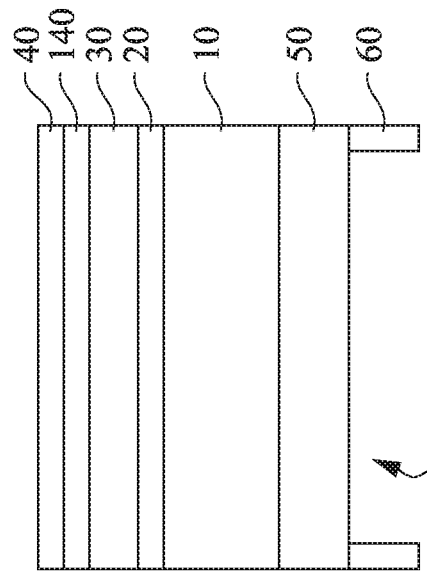
FIG. 17 shows a cross sectional view of one of the various stages for manufacturing a pellicle for an EUV photo mask in accordance with another embodiment of the present disclosure.

Next, as shown in FIG. 17, a backside coating layer 50 is formed over the back side of the substrate 10. The backside coating layer 50 includes one or more layers of dielectric material, such as silicon oxide, silicon nitride, silicon oxynitride and SiCN. In other embodiments, a metallic layer is used. The thickness of the backside coating layer 50 is in a range from about 100 nm to about 1000 nm in some embodiments, and is in a range from about 200 nm to about 500 nm in other embodiments. The backside coating layer 50 can be formed by CVD, PVD, ALD and any other suitable film formation methods.

Figure 18:
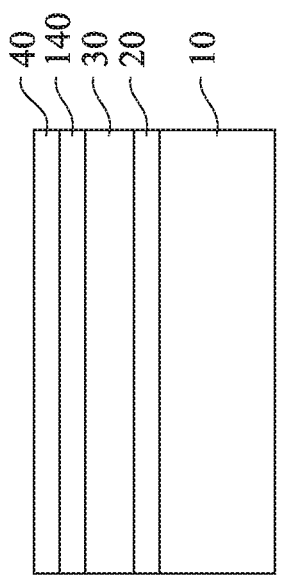
FIG. 18 shows a cross sectional view of one of the various stages for manufacturing a pellicle for an EUV photo mask in accordance with another embodiment of the present disclosure.
Figure 19:
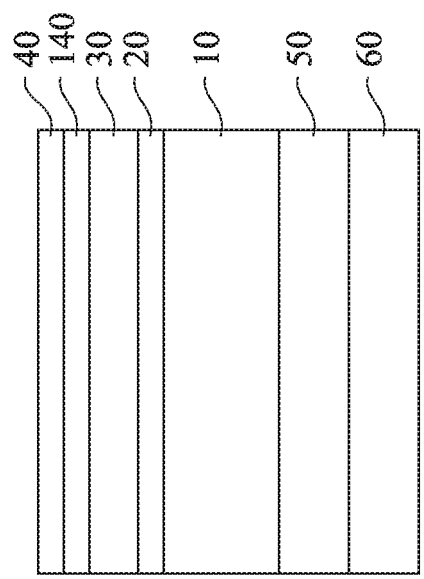
FIG. 19 shows a cross sectional view of one of the various stages for manufacturing a pellicle for an EUV photo mask in accordance with another embodiment of the present disclosure.

Then, as shown in FIG. 18, a photo resist layer 60 is formed on the backside coating layer 50. The thickness of the photo resist layer 60 is in a range from about 1 μm to about 3 μm in some embodiments, one or more lithography operations are performed to pattern the photo resist layer 60 to form a first opening 65 as shown FIG. 19.

Figure 20:
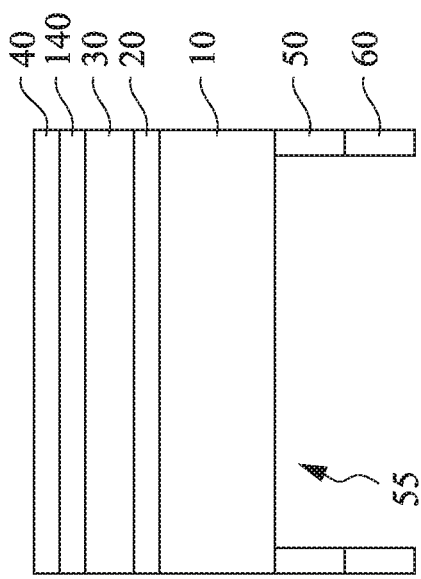
FIG. 20 shows a cross sectional view of one of the various stages for manufacturing a pellicle for an EUV photo mask in accordance with another embodiment of the present disclosure.
Figure 21:
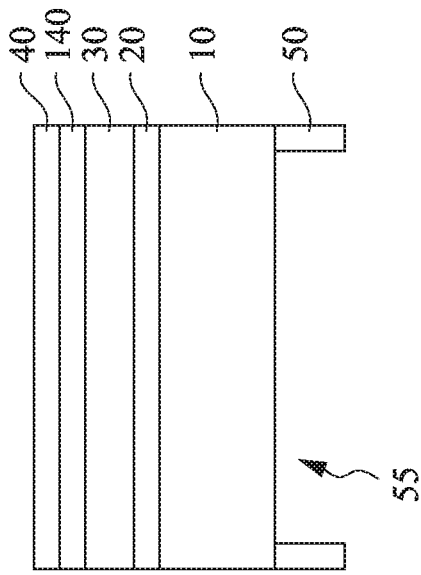
FIG. 21 shows a cross sectional view of one of the various stages for manufacturing a pellicle for an EUV photo mask in accordance with another embodiment of the present disclosure.

Then, the backside coating layer 50 is etched by using the patterned photo resist layer 60 as an etching mask to form a second opening 55, as shown in FIG. 20. The etching is one or more of dry etching and wet etching operations. The photo resist layer 60 is removed by suitable resist removal operations, as shown in FIG. 21.

Figure 22:
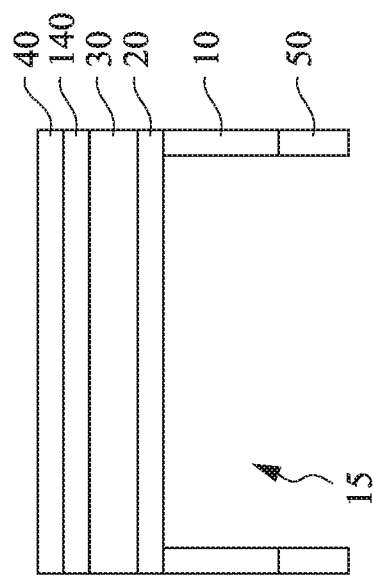
FIG. 22 shows a cross sectional view of one of the various stages for manufacturing a pellicle for an EUV photo mask in accordance with another embodiment of the present disclosure.

Then, the substrate 10 is etched to form a third opening 15, as shown in FIG. 22. In some embodiments, wet etching using KOH, TMAH (tetramethylammonium hydroxide) or EDP (ethylenediamine pyrocatechol) is performed to etch the Si substrate 10. The substrate 10 can also be etched by a dry etching process using one or more of $SF_6$, $CF_4$ and $Cl_2$ gas, mixed with $N_2$ and/or $O_2$ gas. In some embodiments, the substrate below the third opening 15 is etched to expose the first capping layer 20. By this etching operation, a frame structure of the pellicle is formed by a part of the substrate 10 and a part of the backside coating layer 50.

Figure 23:
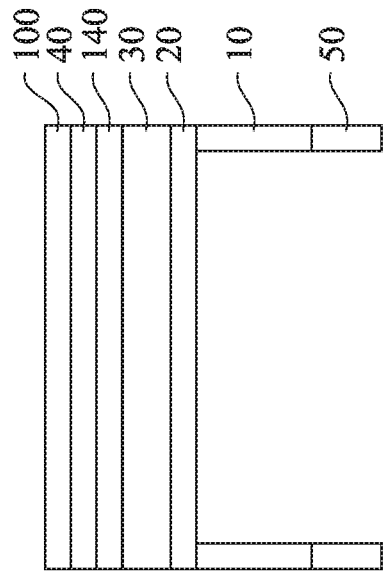
FIG. 23 shows a cross sectional view of one of the various stages for manufacturing a pellicle for an EUV photo mask in accordance with another embodiment of the present disclosure.

Next, as shown in FIG. 23, one or more metallic layers 100 are formed over the second capping layer 40. In some embodiments, the metallic layer 100 includes a layer of Mo, Zr, Nb, B, Ti, Ru, MoSi, ZrSi, NbSi or NiZrSi, or other suitable material. In some embodiments, the metallic layer 100 includes a Ru layer. In some embodiments, the metallic layer 100 includes a Ru layer formed on a Mo layer or a MoSi layer. In other embodiments, a Ru layer formed on a Zr layer is used. In certain embodiments, only a Zr layer is used as the metallic layer 100. In certain embodiments, only a Ru layer is used as the metallic layer 100. The thickness of the metallic layer 100 is in a range from about 0.5 nm to about 20 nm in some embodiments, and is in a range from about 1 nm to about 10 nm in other embodiments. The metallic layer 100 can be respectively formed by CVD, PVD, ALD, electro plating, and any other suitable film formation methods. In certain embodiments, any or all of the metallic layers are further formed on inside walls of the third opening 15. In some embodiments, all of the layers of the pellicle are solid and non-porous layers. In certain embodiments, all of the layers of the pellicle are inorganic.

FIGS. 24-35 show a sequential manufacturing operation for a pellicle for an EUV photo mask in accordance with an embodiment of the present disclosure. It is understood that additional operations can be provided before, during, and after the processes shown by FIGS. 24-35, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1-23 may be employed in the following embodiments, and some of the explanations may be omitted.

Figure 24:
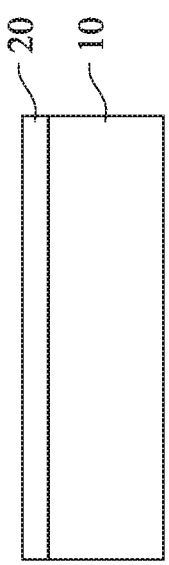
FIG. 24 shows a cross sectional view of one of the various stages for manufacturing a pellicle for an EUV photo mask in accordance with another embodiment of the present disclosure.

A substrate 10, for example a Si wafer, is prepared. The thickness of the substrate 10 is in a range from about 500 μm to about 1000 μm in some embodiments. On the substrate 10, a first capping layer 20, as an etching stop layer, is formed, as shown in FIG. 24. The first capping layer 20 functions as an etching stop layer in a subsequent substrate etching operation. The first capping layer 20 includes one or more layers of semiconductor material, such as SiC, SiGe, Ge; or dielectric material, such as silicon oxide, SiCN, silicon nitride and silicon oxynitride; or any other suitable material. In some embodiments, SiC is epitaxially formed on the substrate 10. In other embodiments, the first capping layer 20 can be an amorphous or polycrystalline SiC, SiGe or Ge layer. In certain embodiments, the first capping layer 20 is silicon nitride. The thickness of the capping layer is in a range from about 0.5 nm to about 40 nm in some embodiments, and is in a range from about 1 nm to about 20 nm in other embodiments. The first capping layer 20 can be formed by chemical vapor deposition (CVD), physical vapor deposition (PVD), atomic layer deposition (ALD), molecular beam epitaxy (MBE) and any other suitable film formation methods.

Figure 25:
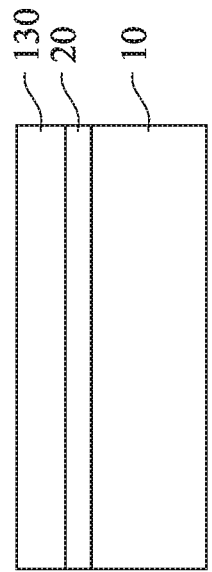
FIG. 25 shows a cross sectional view of one of the various stages for manufacturing a pellicle for an EUV photo mask in accordance with another embodiment of the present disclosure.

Next, as shown in FIG. 25, a base matrix layer 130 is formed on the first capping layer 20. In some embodiments, the base matrix layer 130 includes semiconductor material, such as Si, SiC, SiGe; metal alloys, such as silicide (WSi, NiSi, TiSi, CoSi, MoSi, etc.); or dielectric material, such as silicon nitride. The semiconductor material can be single crystalline, poly crystalline or amorphous. In certain embodiments, the base matrix layer 130 includes a poly silicon layer or an amorphous silicon layer. The thickness of the base matrix layer 130 is in a range from about 10 nm to about 50 nm in some embodiments, and is in a range from about 20 nm to about 40 nm in other embodiments. The matrix layer 130 can be formed by CVD, PVD, ALD, MBE and any other suitable film formation methods.

Figure 26:
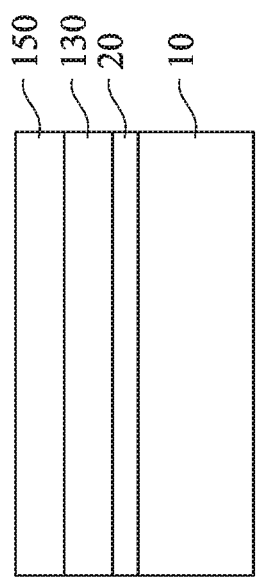
FIG. 26 shows a cross sectional view of one of the various stages for manufacturing a pellicle for an EUV photo mask in accordance with another embodiment of the present disclosure.

Next, as shown in FIG. 26, a base stable layer 150 is formed over the base matrix layer 130. The base stable layer 150 includes one or more layers of metal based material, for example, Mo, Zr, Ru and Nb and their alloy, in some embodiments. The thickness of the base stable layer 150 is in a range from about 1 nm to about 20 nm in some embodiments. The base stable layer 150 can be formed by CVD, PVD, ALD and any other suitable film formation methods.

Figure 27:
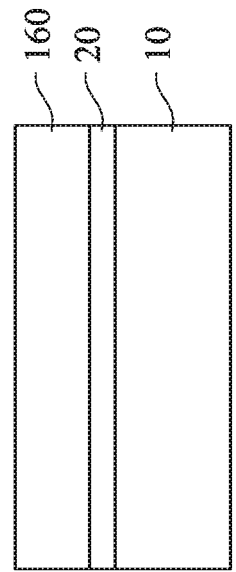
FIG. 27 shows a cross sectional view of one of the various stages for manufacturing a pellicle for an EUV photo mask in accordance with another embodiment of the present disclosure.

Then, as shown in FIG. 27, the base matrix layer 130 and the base stable layer 150 are mixed to form an alloy layer 160 by an annealing operation. In some embodiments, the alloy layer 160 is a silicide layer, such as MoSi, NbSi, ZrSi, RuSi, etc. Compared with directly forming a silicide layer as the matrix layer 30, forming a silicide layer over the substrate can improve a surface roughness (smoother surface) and suppress phase separation, which would otherwise be caused by a subsequent high temperature process.

Figure 28:
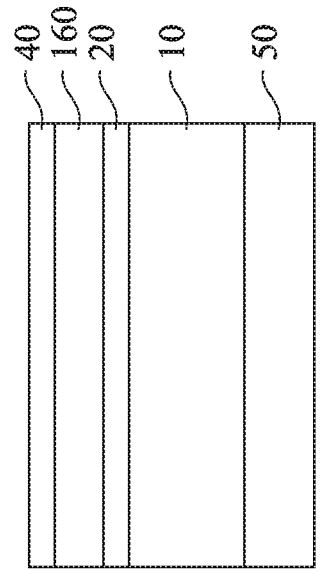
FIG. 28 shows a cross sectional view of one of the various stages for manufacturing a pellicle for an EUV photo mask in accordance with another embodiment of the present disclosure.

Then, a second capping layer 40 is formed over the alloy layer 160, as show in FIG. 28. The second capping layer 40 includes one or more layers of silicon nitride and SiC, in some embodiments. In other embodiments, the second capping layer 40 is formed by implanting impurities in the Si core layer. The impurities can be boron, phosphorous and/or arsenic. The thickness of the second capping layer 40 is in a range from about 0.5 nm to about 10 nm in some embodiments, and is in a range from about 1 nm to about 5 nm in other embodiments. The second capping layer 40 can be formed by CVD, PVD, ALD and any other suitable film formation methods.

Figure 29:
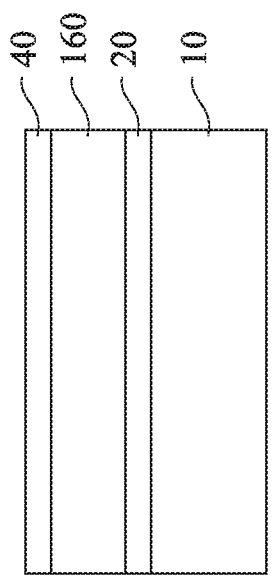
FIG. 29 shows a cross sectional view of one of the various stages for manufacturing a pellicle for an EUV photo mask in accordance with another embodiment of the present disclosure.
Figure 31:
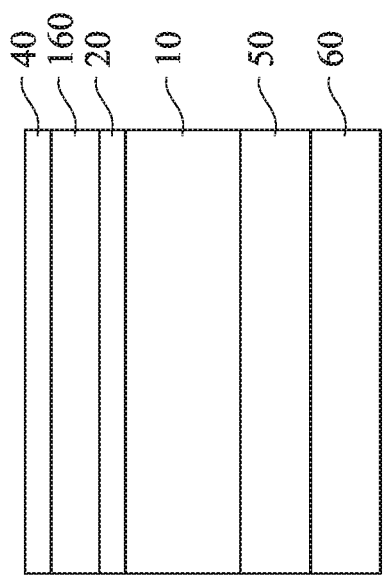
FIG. 31 shows a cross sectional view of one of the various stages for manufacturing a pellicle for an EUV photo mask in accordance with another embodiment of the present disclosure.

Next, as shown in FIG. 29, a backside coating layer 50 is formed over the back side of the substrate 10. The backside coating layer 50 includes one or more layers of dielectric material, such as silicon oxide, silicon nitride, silicon oxynitride and SiCN. In other embodiments, a metallic layer is used. The thickness of the backside coating layer 50 is in a range from about 100 nm to about 1000 nm in some embodiments, and is in a range from about 200 nm to about 500 nm in other embodiments. The backside coating layer 50 can be formed by CVD, PVD, ALD, MBE and any other suitable film formation methods.

Figure 30:
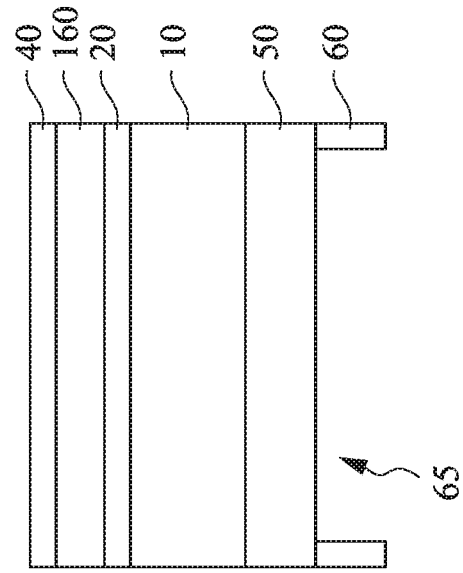
FIG. 30 shows a cross sectional view of one of the various stages for manufacturing a pellicle for an EUV photo mask in accordance with another embodiment of the present disclosure.

Then, as shown in FIG. 30, a photo resist layer 60 is formed on the backside coating layer 50. The thickness of the photo resist layer 60 is in a range from about 1 μm to about 3 μm in some embodiments, one or more lithography operations are performed to pattern the photo resist layer 60 to form a first opening 65 as shown FIG. 31.

Figure 32:
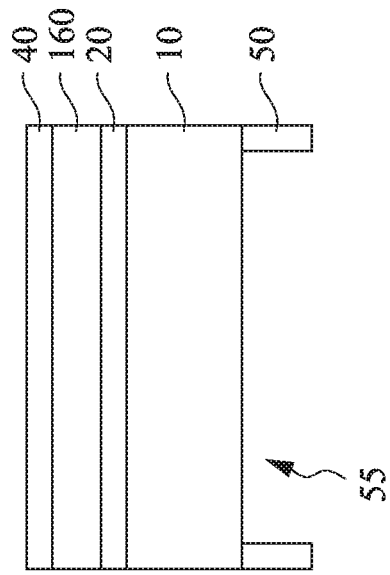
FIG. 32 shows a cross sectional view of one of the various stages for manufacturing a pellicle for an EUV photo mask in accordance with another embodiment of the present disclosure.
Figure 33:
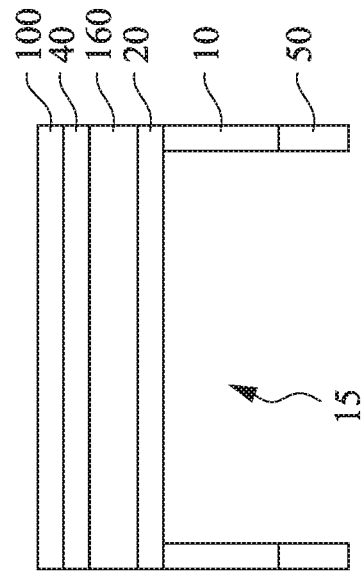
FIG. 33 shows a cross sectional view of one of the various stages for manufacturing a pellicle for an EUV photo mask in accordance with another embodiment of the present disclosure.

Then, the backside coating layer 50 is etched by using the patterned photo resist layer 60 as an etching mask to form a second opening 55, as shown in FIG. 32. The etching is one or more of dry etching and wet etching operations. The photo resist layer 60 is removed by suitable resist removal operations, as shown in FIG. 33.

Figure 34:
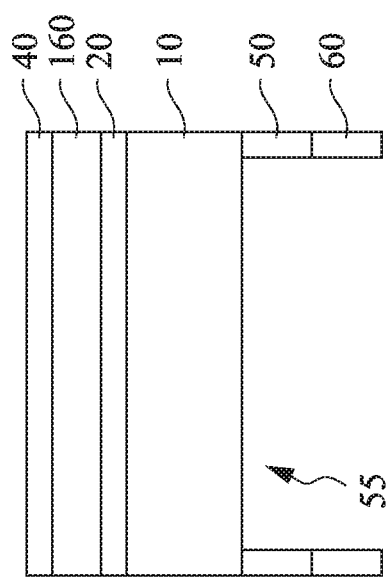
FIG. 34 shows a cross sectional view of one of the various stages for manufacturing a pellicle for an EUV photo mask in accordance with another embodiment of the present disclosure.

Then, the substrate 10 is etched to form a third opening 15, as shown in FIG. 34. In some embodiments, wet etching using KOH, TMAH (tetramethylammonium hydroxide) or EDP (ethylenediamine pyrocatechol) is performed to etch the Si substrate 10. The substrate 10 can also be etched by a dry etching process using one or more of $SF_6$, $CF_4$ and $Cl_2$ gas, mixed with $N_2$ and/or $O_2$ gas. In some embodiments, the substrate below the third opening 15 is etched to expose the first capping layer 20. By this etching operation, a frame structure of the pellicle is formed by a part of the substrate 10 and a part of the backside coating layer 50.

Figure 35:
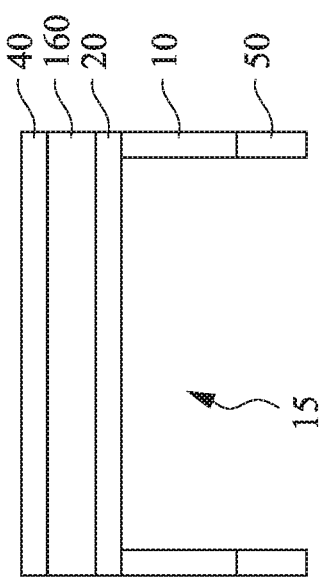
FIG. 35 shows a cross sectional view of one of the various stages for manufacturing a pellicle for an EUV photo mask in accordance with another embodiment of the present disclosure.

Next, as shown in FIG. 35, one or more metallic layers 100 are formed over the second capping layer 40. In some embodiments, the metallic layer 100 includes a layer of Mo, Zr, Nb, B, Ti, Ru, MoSi, ZrSi, NbSi or NiZrSi, or other suitable material. In some embodiments, the metallic layer 100 includes a Ru layer. In some embodiments, the metallic layer 100 includes a Ru layer formed on a Mo layer or on a MoSi layer. In other embodiments, a Ru layer formed on a Zr layer is used. In certain embodiments, only a Zr layer is used as the metallic layer 100. In certain embodiments, only a Ru layer is used as the metallic layer 100. The thickness of the metallic layer 100 is in a range from about 0.5 nm to about 20 nm in some embodiments, and is in a range from about 1 nm to about 10 nm in other embodiments. The metallic layer 100 can be respectively formed by CVD, PVD, ALD, electro plating, and any other suitable film formation methods. In certain embodiments, any or all of the metallic layers are further formed on inside walls of the third opening 15. In some embodiments, all of the layers of the pellicle are solid and non-porous layers. In certain embodiments, all of the layers of the pellicle are inorganic.

Figure 36:
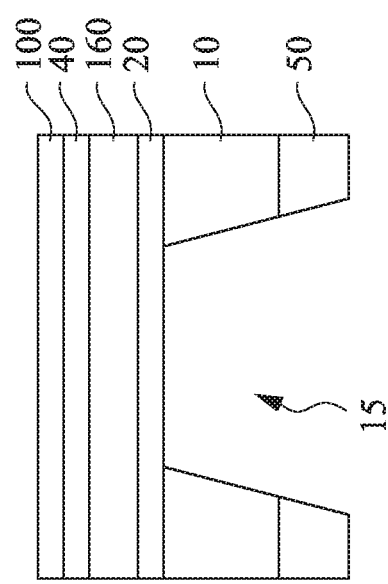
FIG. 36 shows a cross sectional view of a pellicle for an EUV photo mask in accordance with another embodiment of the present disclosure.

FIG. 36 shows a cross sectional view of a pellicle for an EUV photo mask in accordance with another embodiment of the present disclosure. In this embodiment, the frame structure has a tapered shape having a larger opening at the backside coating layer 50 side than at the first capping layer 20 side. The tapered shape frame is formed by using isotropic etching operation in some embodiments. The tapered shape frame can be applied to any embodiments as set forth above.

Figure 37:
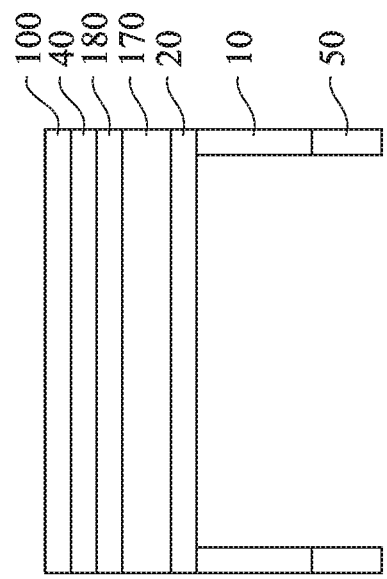
FIG. 37 shows a cross sectional view of a pellicle for an EUV photo mask in accordance with another embodiment of the present disclosure.

FIG. 37 shows a cross sectional view of a pellicle for an EUV photo mask in accordance with another embodiment of the present disclosure. Materials, configurations, dimensions, structures, conditions and operations the same as or similar to those explained with respect to FIGS. 1-36 may be employed in the following embodiments, and some of the explanations may be omitted.

In this embodiment, the pellicle includes a first matrix layer 170 on the first capping layer 20, a second matrix layer 180 on the first matrix layer 170, and a second capping layer 40 and a metallic layer 100 on the second matrix layer 180. In some embodiments, the first matrix layer 170 includes a semiconductor material, such as Si, SiC and SiGe. The semiconductor material can be single crystalline, poly crystalline or amorphous. In certain embodiments, the first matrix layer 170 includes a poly silicon layer or an amorphous silicon layer. The thickness of the first matrix layer 170 is in a range from about 10 nm to about 50 nm in some embodiments, and is in a range from about 20 nm to about 40 nm in other embodiments. The second matrix layer 180 includes a silicide, such as WSi, NiSi, TiSi, CoSi, MoSi, NbSi, ZrSi, NbZrSi or etc. In certain embodiments, the second matrix layer 180 includes a MoSi layer or a ZrSi layer. In some embodiments, the silicide layer is subjected to a nitridation operation or an oxidation operation to form, for example, MoSiN, ZrSiN, MoSiO or ZrSiO. The thickness of the second matrix layer 180 is in a range from about 10 nm to about 50 nm in some embodiments, and is in a range from about 20 nm to about 40 nm in other embodiments.

Figure 38:
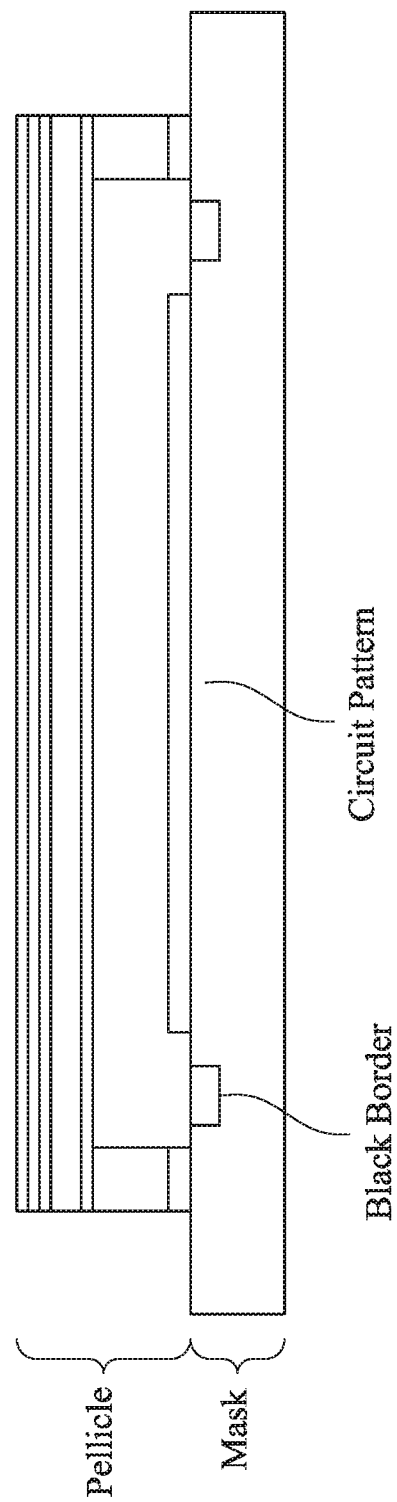
FIG. 38 shows a cross sectional view illustrating a pellicle attached to an EUV photo mask in accordance with an embodiment of the present disclosure.

FIG. 38 shows a cross sectional view illustrating a pellicle attached to an EUV photo mask in accordance with an embodiment of the present disclosure. The frame structure of the pellicle is attached to the surface of the EUV photo mask with an appropriate bonding material. In some embodiments, the bonding material is an adhesive, such as acrylic or silicon based glue or A-B cross link type glue. The size of the frame structure is larger than the area of the black borders of the EUV photo mask so that the pellicle covers not only the circuit pattern area of the photo mask but also the black borders.

In some embodiments of the present disclosure, a photo resist pattern is formed by using the EUV photo mask with the pellicle as described above. The EUV photo mask with the pellicle is set in an EUV exposure tool. A substrate (wafer) coated with a photo resist is also placed in the EUV exposure tool. EUV light is generated at an EUV light source and guided on to the EUV photo mask through the pellicle. The EUV light is then reflected by the EUV photo mask and the reflected light having the circuit pattern information is guided on to the photo resist layer on the substrate. A developing operation is subsequently performed to form a photo resist pattern. Then, by using the photo resist pattern as an etching mask, an under-layer is patterned by one or more etching operations to manufacturing patterns for a semiconductor device.

The pellicles according to embodiments of the present disclosure can provide a higher strength and thermal conductivity (dissipation) as well as higher EUV transmittance and lower EUV reflectance than conventional pellicles.

It will be understood that not all advantages have been necessarily discussed herein, no particular advantage is required for all embodiments or examples, and other embodiments or examples may offer different advantages.

In accordance with one aspect of the present disclosure, a pellicle for an EUV photo mask includes a first capping layer, a matrix layer disposed over the first capping layer, a second capping layer disposed over the matrix layer, and a metallic layer disposed over the second capping layer. In one or more of the foregoing and following embodiments, the matrix layer is made of a silicide. In one or more of the foregoing and following embodiments, the silicide is MoSi or ZrSi. In one or more of the foregoing and following embodiments, the first capping layer and the second capping layer are made of one or more of silicon oxide, silicon nitride, silicon oxynitride, SiC and SiCN. In one or more of the foregoing and following embodiments, the first capping layer and the second capping layer are made of a same material. In one or more of the foregoing and following embodiments, the first capping layer and the second capping layer are made of different materials from each other. In one or more of the foregoing and following embodiments, the metallic layer is one or more of a Ru layer, a Mo layer and a Zr layer.

In accordance with another aspect of the present disclosure, a pellicle for an EUV photo mask includes a first capping layer, a matrix layer disposed over the first capping layer, a stable layer disposed over the matrix layer, a second capping layer disposed over the stable layer, and a metallic layer disposed over the stable layer. In one or more of the foregoing and following embodiments, the stable layer is one or more of a Nb layer, a boron layer and a carbon layer. In one or more of the foregoing and following embodiments, the matrix layer is made of silicide. In one or more of the foregoing and following embodiments, the silicide is one or more of MoSi, ZrSi and NbSi. In one or more of the foregoing and following embodiments, the first capping layer and the second capping layer are made of one or more of silicon oxide, silicon nitride, silicon oxynitride, SiC and SiCN. In one or more of the foregoing and following embodiments, the first capping layer and the second capping layer are made of a same material. In one or more of the foregoing and following embodiments, the first capping layer and the second capping layer are made of different materials from each other. In one or more of the foregoing and following embodiments, the metallic layer is one or more of a Ru layer, a Mo layer and a Zr layer. In one or more of the foregoing and following embodiments, a thickness of the stable layer is in a range from 0.5 nm to 10 nm. In one or more of the foregoing and following embodiments, the matrix layer is one of a poly silicon layer and an amorphous silicon layer, and the stable layer is one or more of a MoSi layer, a ZrSi layer, and a NbSi layer.

In accordance with another aspect of the present disclosure, in a method of manufacturing a pellicle for an EUV photo mask, a first capping layer is formed over a front surface of a substrate. A first base matrix layer is formed over the first capping layer. A second base matrix layer is formed over the first base matrix layer. An alloy, as an alloy matrix layer, is formed from the first base matrix layer and the second base matrix layer by a thermal operation. A second capping layer is formed over the alloy matrix layer. A backside coating layer is formed on a back surface of the substrate. A first opening is formed in the backside coating layer by patterning the backside coating layer. A second opening is formed in the substrate by etching the substrate through the first opening. One or more metallic layers are formed over the second capping layer. In one or more of the foregoing and following embodiments, the first base matrix layer is poly silicon or amorphous silicon, and the second base matrix layer is one or more of Mo, Zr and Nb.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A pellicle for an EUV photo mask, comprising:
a first capping layer;
a matrix layer disposed over the first capping layer;
a second capping layer disposed over the matrix layer; and
a metallic layer disposed over the second capping layer.

2. The pellicle of claim 1, wherein the matrix layer is made of a silicide.

3. The pellicle of claim 2, wherein the silicide is MoSi or ZrSi.

4. The pellicle of claim 1, wherein the first capping layer and the second capping layer are made of one or more of silicon oxide, silicon nitride, silicon oxynitride, SiC and SiCN.

5. The pellicle of claim 4, wherein the first capping layer and the second capping layer are made of a same material.

6. The pellicle of claim 4 wherein the first capping layer and the second capping layer are made of different materials from each other.

7. The pellicle of claim 1, wherein the metallic layer is one or more of a Ru layer, a Mo layer and a Zr layer.

8. A pellicle for an EUV photo mask, comprising:
a first capping layer;
a matrix layer disposed over the first capping layer;
a stable layer disposed over the matrix layer;
a second capping layer disposed over the stable layer; and
a metallic layer disposed over the stable layer.

9. The pellicle of claim 8, wherein the stable layer is one or more of a Nb layer, a boron layer and a carbon layer.

10. The pellicle of claim 9, wherein the matrix layer is made of a silicide.

11. The pellicle of claim 10, wherein the silicide is one or more of MoSi, ZrSi and NbSi.

12. The pellicle of claim 8, wherein the first capping layer and the second capping layer are made of one or more of silicon oxide, silicon nitride, silicon oxynitride, SiC and SiCN.

13. The pellicle of claim 12, wherein the first capping layer and the second capping layer are made of a same material.

14. The pellicle of claim 12, wherein the first capping layer and the second capping layer are made of different materials from each other.

15. The pellicle of claim 10, wherein the metallic layer is one or more of a Ru layer, a Mo layer and a Zr layer.

16. The pellicle of claim 8, wherein a thickness of the stable layer is in a range from 0.5 nm to 10 nm.

17. The pellicle of claim 8, wherein:
the matrix layer is one of a poly silicon layer and an amorphous silicon layer, and
the stable layer is one or more of a MoSi layer, a ZrSi layer, and a NbSi layer.

18. A method of manufacturing a pellicle for an EUV photo mask, the method comprising:
forming a first capping layer over a front surface of a substrate;
forming a first base matrix layer over the first capping layer;
forming a second base matrix layer over the first base matrix layer;
forming an alloy, as an alloy matrix layer, from the first base matrix layer and the second base matrix layer by a thermal operation;
forming a second capping layer over the alloy matrix layer;
forming a backside coating layer on a back surface of the substrate;
forming a first opening in the backside coating layer by patterning the backside coating layer;
forming a second opening in the substrate by etching the substrate through the first opening; and
forming one or more metallic layers over the second capping layer.

19. The method of claim 18, wherein the first base matrix layer is poly silicon or amorphous silicon, and the second base matrix layer is one or more of Mo, Zr and Nb.

20. The method of claim 19, wherein the metallic layer is one or more of a Zr layer.

* * * * *